United States Patent

Hadizad et al.

[11] Patent Number: 5,949,124
[45] Date of Patent: Sep. 7, 1999

[54] EDGE TERMINATION STRUCTURE

[75] Inventors: Peyman Hadizad, Scottsdale; Zheng Shen, Chandler; Ali Salih, Tempe, all of Ariz.

[73] Assignee: Motorola, Inc., Schaumburg, Ill.

[21] Appl. No.: 08/999,889

[22] Filed: May 9, 1997

Related U.S. Application Data

[63] Continuation-in-part of application No. 08/558,583, Oct. 31, 1995, abandoned.

[51] Int. Cl.$^6$ .................................................. H01L 23/58
[52] U.S. Cl. .......................... 257/496; 257/487; 257/622
[58] Field of Search .................................. 257/496, 495, 257/487, 491, 622

[56] References Cited

U.S. PATENT DOCUMENTS

| | | | |
|---|---|---|---|
| 3,335,296 | 8/1967 | Smart | 257/495 |
| 3,414,780 | 12/1968 | Diebold | 257/496 |
| 4,646,115 | 2/1987 | Shannon et al. | 257/496 |
| 4,750,028 | 6/1988 | Ludikhuize | 257/495 |
| 4,982,260 | 1/1991 | Chang et al. | 257/656 |
| 5,233,215 | 8/1993 | Baliga | 257/496 |
| 5,387,528 | 2/1995 | Hutchings et al. | 437/40 |
| 5,430,324 | 7/1995 | Bencuya | 257/495 |

FOREIGN PATENT DOCUMENTS 1-49263  2/1989  Japan ...................................... 257/496

*Primary Examiner*—John Guay
*Attorney, Agent, or Firm*—Daniel R. Collopy; Rennie William Dover

[57] ABSTRACT

An edge termination structure is created by forming trench structures (14) near a PN junction. The presence of the trench structures (14) extends a depletion region (13) between a doped region (12) and a body of semiconductor material or a semiconductor substrate (11) of the opposite conductivity type away from the doped region (12). This in turn forces junction breakdown to occur in the semiconductor bulk, leading to enhancement of the breakdown voltage of a semiconductor device (10). A surface of the trench structures (14) is covered with a conductive layer (16) which keeps the surface of the trench structures (14) at an equal voltage potential. This creates an equipotential surface across each of the trench structures (14) and forces the depletion region to extend laterally along the surface of semiconductor substrate (11). The conductive layers (16) are electrically isolated from an electrical contact (17) which contacts the doped region (12) and from the conductive layers (16) of neighboring trench structures (14).

20 Claims, 1 Drawing Sheet

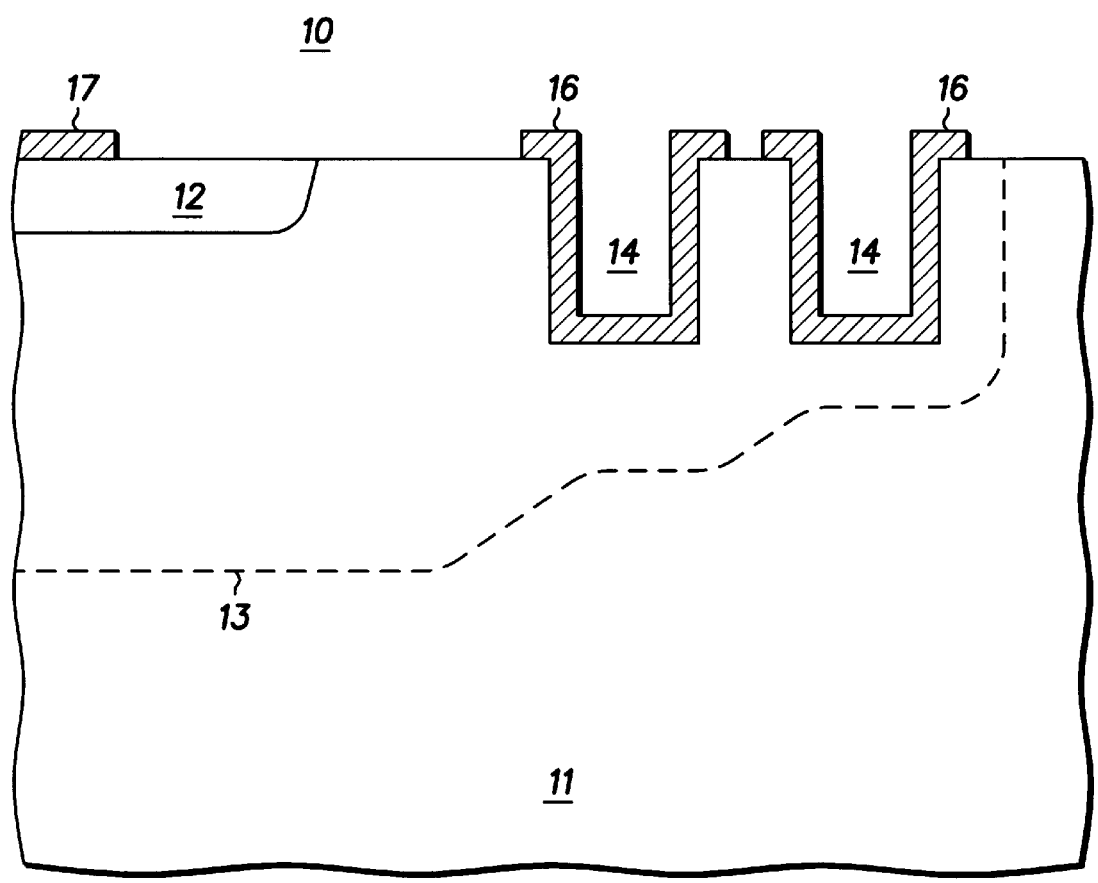

EDGE TERMINATION STRUCTURE

This application is a continuation of prior application Ser. No. 08/558,583, filed Oct. 31, 1995, now abandoned.

BACKGROUND OF THE INVENTION

This invention relates, in general, to semiconductor devices, and more particularly, to edge termination structures for such devices.

Traditional power semiconductor devices comprise a PN junction which is created by forming a p-type doped region in an n-type semiconductor substrate. Surrounding the p-type region is a depletion region which is due to the balance of charge between regions of opposite conductivities. In power devices it is important that the breakdown voltage of the PN junction be as high as possible and for breakdown to occur in the bulk substrate, away from the surface of the semiconductor device. To improve the breakdown voltage and the performance of power semiconductor devices, edge termination structures have previously been employed.

One prior method for forming edge termination structures forms concentric floating diffusion rings around the power semiconductor device. Typically a plurality of diffusion rings are formed which are intended to extend the depletion region away from the PN junction at the surface. In order to be effective in high voltage devices, the diffusion rings need to be quite large and deep. Due to the large thermal budget required and, in many cases, the difficulty of process control and reproducibility, these ring structures can be difficult to process and also increase the final die size of the power semiconductor device. This in turn will increase the manufacturing cost of the semiconductor device.

A second prior method for extending the location of the depletion region at the surface of the substrate uses a thick insulator layer. A 1 µm to 2 µm thick layer of insulator material is deposited and patterned near the edge of the PN junction to be protected. A portion of the conductive layer used to connect to the PN junction is then extended over this insulator to create a planar field plate. This will increase the width of the depletion region near the surface and move the edge of the depletion region away from the p-type region at the surface. Although the insulator layer takes up less real estate on a semiconductor substrate, in practice this technique can only provide breakdown voltage enhancement up to 500 volts due to the requirements of the thickness and stress in the insulator materials.

A third prior method for increasing the breakdown voltage of a PN junction forms a resistive region at the surface of the semiconductor substrate near the PN junction. Using an appropriate implant species, lattice damage is created by implanting the surface with a high implant energy. This damaged region increases the surface resistivity of the semiconductor device which in turn extends the depletion region away from the PN junction. This lattice damage, however, will also increase the leakage current of the power semiconductor device which will in turn, degrade other performance characteristics of the device. Such a method also requires accurate control and reproducibility of the lattice defect distribution and adds to the process complexity of the semiconductor device.

By now, it should be appreciated that it would be advantageous to provide an improved method for increasing the breakdown voltage of a PN junction. It would be of further advantage if the breakdown voltage of the device was not dependent on the geometrical contour shape of the PN junction or the surface charge of the substrate, but rather on the doping of the junction regions. It would be of even further advantage if the method could increase the breakdown voltage of a PN junction to beyond 500 volts.

BRIEF DESCRIPTION OF THE DRAWING

The FIGURE is an enlarged cross-sectional view of a portion of a semiconductor device according to the present invention.

DETAILED DESCRIPTION OF THE DRAWING

The figure is an enlarged cross-sectional view of a portion of a semiconductor device 10 according to the present invention. The teachings of the present invention provide a trench structure 14 which is used to provide edge termination for a depletion region 13. Depletion region 13 is formed when two regions of semiconductor material with opposite conductivities come in contact with each other. As shown in the figure, a PN junction is created by forming a p-type doped region 12 in an n-type body of semiconductor material or an n-type semiconductor substrate 11. It should be understood that the conductivities of doped region 12 and semiconductor substrate 11 can also be reversed in other embodiments. It should also be understood that the PN junction to be protected can be a stand-alone diode, a power diode, or a portion of a semiconductor device such as an insulated gate bipolar junction transistor, a bipolar junction transistor, a field effect transistor, or a thyristor.

The breakdown characteristics of a PN junction are determined by the electric field distribution in depletion region 13, which is formed between the two regions of the PN junction. The shape of depletion region 13 follows the edge contour of doped region 12. If it were not for the presence of a properly designed edge termination structure, depletion region 13 would follow the radius of curvature of the PN junction and terminate sharply near doped region 12 at the surface. Due to the finite radius of curvature of the PN junction at it edges, the associated electric field, and depletion region 13, have the highest rate of change near the surface of semiconductor substrate 11. This tends to dictate the maximum breakdown voltage of semiconductor device 10. The breakdown voltage of a PN junction can be improved by extending depletion region 13 away from doped region 12 at the surface of semiconductor substrate 11. To do this, one or several trench structures 14 are formed close to, and isolated from doped region 12. In order to allow depletion region 13 to extend beyond trench structures 14, a surface of trench structure 14 is covered with a floating, conductive layer 16 which is electrically isolated from an electrical contact 17 to doped region 12. This creates an equipotential surface on trench structure 14.

The figure shows the impact of the presence of trench structures 14 on depletion region 13. Based on the two dimensional recessed geometry (aspect ratio) of the appropriately spaced trench structures 14, and the equipotential surface created by the floating, conductive layers 16, depletion region 13 is forced to extend away from doped region 12. In contrast, if an insulator layer was placed on the surface of trench structures 14, or in between the surface of trench structure 14 and conductive layer 16, shielding of semiconductor substrate 11 from conductive layer 16 would result, and the desired shaping of depletion region 13 would not occur. The width, depth, and spacing of trench structures 14 can be varied to adjust the profile of depletion region 13 so semiconductor device 10 can be formed with the desired performance and breakdown characteristics. Typically trench structures 14 are formed so they are 0.5 μm to 100 μm from the edge of doped region 12 and can be formed such that they are at least 0.1 μm to 10 μm deep.

A method for forming semiconductor device 10 will now be provided by forming semiconductor device 10 in a gallium arsenide substrate. It should be understood that the present invention is also applicable to any PN junction formed in a silicon substrate or substrates made from other compound semiconductor materials. First a 500 Å to 1,000 Å layer of silicon nitride is deposited on semiconductor substrate 11. The silicon nitride layer is then patterned with a photoresist layer and etched with a reactive ion etch (RIE) to expose semiconductor substrate 11 where doped regions 12 are formed. Semiconductor substrate 11 is then implanted with a p-type species such as beryllium, and the photoresist layer and remaining portions of the silicon nitride layer are then removed to expose semiconductor substrate 11.

A second layer of photoresist is then deposited and patterned to expose the portions of semiconductor substrate 11 where trench structures 14 are formed. Either a wet etch using a solution of ammonium hydroxide and hydrogen peroxide, or a fluorine based RIE etch is used to form trench structures 14. The second photoresist layer is then removed and a conductive material such as aluminum, aluminum alloy, titanium, titanium nitride, gold, or titanium tungsten is deposited by either chemical vapor deposition (CVD), sputtering, or evaporation. It is also possible to form conductive layer 16 by CVD depositing a highly doped film of polysilicon.

A third photoresist layer is then deposited and patterned to expose portions of the conductive material. A RIE etch is performed to define an electrical contact 17 to doped region 12 and to define conductive layers 16. Conductive layer 16 for each trench structure 14 is electrically isolated from any neighboring conductive layer 16 and is electrically isolated from electrical contact 17. The third photoresist layer is then removed and a passivating layer of silicon nitride (not shown) can be deposited over semiconductor substrate 11 to protect semiconductor device 10.

As described above, a photoresist layer is used to accurately define the location and width of trench structures 14. Using an RIE etch, the depth of trench structures 14 can be controlled with nearly the same accuracy. In previously known protection structures, doped floating rings are formed in a silicon substrate by implanting the substrate with dopant and then relying on the diffusion of the dopant during thermal cycling to form the termination structure. To prevent dopant from neighboring floating rings from diffusing into each other, the rings must be spaced far enough away from each other which requires additional surface area to form the semiconductor device. Accurate control of the formation of deep heavily doped regions in gallium arsenide substrates is not readily available. The present invention, however, offers a method for forming an edge termination structure with improved control and accuracy over a method which forms doped floating rings. In addition, since the present invention does not require a large thermal budget, dopant redistribution and degradation of materials used to fabricate semiconductor device 10 are minimized.

As described above, trench structures 14 extend depletion region 13 away from doped region 12 near the surface of semiconductor substrate 11. This moves the location where avalanche breakdown of the PN junction occurs away from the surface and into the bulk of semiconductor substrate 11. Using the teachings of the present invention, it is possible to form a PN junction with a breakdown voltage of 300 volts to 2500 volts. This range of protection is not possible with an edge termination structure that uses a thick insulator material near the PN junction. The present invention also requires less surface area than an edge termination structure that requires a plurality of floating rings.

By now it should be appreciated that the present invention provides an edge termination structure for the PN junction of a power semiconductor device 10. A trench structure 14 extends depletion region 13 of the PN junction away from doped region 12 at the surface of semiconductor substrate 11 so that the breakdown process occurs in the bulk and is not dominated by surface effects. Trench structures 14 improve the breakdown voltage of a PN junction such that breakdown occurs at 300 volts to 2500 volts. This is not possible with a planar field plate structure. The present invention does not require the use of heavily doped floating rings which are difficult to form in gallium arsenide and other compound semiconductor substrates and which can require a significant amount of surface area in silicon substrates. The present invention, therefore, offers an edge termination structure which improves the breakdown characteristics of a semiconductor device 10 and can do so with minimal process complexity and thus reduced cost.

We claim:

1. An edge termination structure for a semiconductor device comprising:
    a body of semiconductor material of a first conductivity type, the body of semiconductor material having a major surface;
    a doped region of a second conductivity type formed in the body of semiconductor material;
    a trench structure at the major surface of the body of semiconductor material, wherein the trench structure has a surface and vertical sidewalls that extend from the major surface, the vertical sidewalls being devoid of a PN junction, and the trench structure being separated from the doped region by a first distance and extending vertically into the body of semiconductor material a second distance; and
    a conductive layer formed along the surface of the trench structure, wherein the conductive layer is made from a different material than the body of semiconductor material, and wherein a portion of the conductive layer contacts a portion of the body of semiconductor material.

2. The edge termination structure for a semiconductor device of claim 1, further comprising a depletion region adjacent to a PN junction that is formed between the doped region and the body of semiconductor material.

3. The edge termination structure for a semiconductor device of claim 2, wherein the trench structure extends the depletion region away from the doped region at the surface of the body of semiconductor material.

4. The edge termination structure for a semiconductor device of claim 1, wherein the conductive layer keeps the surface of the trench structure at an essentially equal voltage potential across the surface of the trench structure.

5. The edge termination structure for a semiconductor device of claim 1, further comprising a plurality of trench structures formed in the body of semiconductor material.

6. The edge termination structure for a semiconductor device of claim 1, wherein the first distance between the doped region and the trench structure is 0.5 μm to 100 μm.

7. The edge termination structure for a semiconductor device of claim 1, wherein the second distance the trench structure extends into the body of semiconductor material is 0.1 μm to 10 μm.

8. The edge termination structure for a semiconductor device of claim 1, wherein the conductive layer is selected from the group consisting of aluminum, aluminum alloy, titanium, titanium nitride, titanium tungsten, gold, and doped polysilicon.

9. The edge termination structure for a semiconductor device of claim 1, wherein the doped region is a portion of a semiconductor device selected from the group consisting of an insulated gate bipolar junction transistor, a bipolar junction transistor, a diode, a power diode, a field effect transistor, and a thyristor.

10. An edge termination structure for a semiconductor device comprising:
   a body of semiconductor material of a first conductivity type, the body of semiconductor material having a major surface;
   a doped region of a second conductivity type formed in the body of semiconductor material;
   a trench structure at the major surface of the body of semiconductor material, wherein the trench structure has a surface and vertical sidewalls that extend from the major surface, the vertical sidewalls being devoid of a PN junction, and the trench structure being separated from the doped region by a first distance and extending vertically into the body of semiconductor material a second distance; and
   a conductive layer formed along the surface of the trench structure, wherein the conductive layer is made from a different material than the body of semiconductor material, wherein the semiconductor device has a breakdown voltage of 300 volts to 2500 volts.

11. A semiconductor device comprising:
   a semiconductor substrate comprising a semiconductor material of a first conductivity type;
   a PN junction in the semiconductor substrate;
   a trench structure physically separated from the PN junction by a distance, wherein the trench structure has vertical sidewalls that expose only the semiconductor material of the first conductivity type, and the trench structure increases a breakdown voltage of the PN junction; and
   a conductive layer formed along the surface of the trench structure, wherein the conductive layer is made from a different material than the body of semiconductor material, and wherein a portion of the conductive layer contacts a portion of the semiconductor substrate.

12. The semiconductor device of claim 11, further comprising a conductive layer formed in the trench structure, wherein the conductive layer is a separate layer from the semiconductor substrate.

13. The semiconductor device of claim 12, wherein the conductive layer is selected from the group consisting of aluminum, aluminum alloy, titanium, titanium nitride, titanium tungsten, gold, and doped polysilicon.

14. The semiconductor device of claim 11, wherein the PN junction is a portion of a semiconductor device selected from the group consisting of an insulated gate bipolar junction transistor, a bipolar junction transistor, a diode, a power diode, a field effect transistor, and a thyristor.

15. A PN junction comprising:
   a semiconductor substrate of a first conductivity type;
   a doped region of a second conductivity type forming a PN junction and a depletion region around the doped region; and
   a trench structure formed in the semiconductor substrate and having a surface covered with a conductive material, the trench structure having vertical sidewalls that expose only the semiconductor substrate of the first conductivity type; and
   a conductive layer formed along the surface of the trench structure, wherein the conductive layer is made from a different material than the body of semiconductor material, and wherein a portion of the conductive layer contacts the body of semiconductor material.

16. The PN junction of claim 15, further comprising a plurality of trench structures formed in the semiconductor substrate.

17. The PN junction of claim 15, wherein the doped region and the trench structure are separated by 0.5 $\mu$m to 100 $\mu$m.

18. The PN junction of claim 15, wherein the conductive material is selected from the group consisting of aluminum, aluminum alloy, titanium, titanium nitride, titanium tungsten, gold, and doped polysilicon.

19. The PN junction of claim 15, wherein the PN junction is a portion of a semiconductor device selected from the group consisting of an insulated gate bipolar junction transistor, a bipolar junction transistor, a diode, a power diode, a field effect transistor, and a thyristor.

20. The PN junction of claim 15, wherein the PN junction has a breakdown voltage of 300 volts to 2500 volts.

* * * * *